United States Patent [19]

Miller et al.

[11] Patent Number: 5,237,460

[45] Date of Patent: Aug. 17, 1993

[54] STORAGE OF COMPRESSED DATA ON RANDOM ACCESS STORAGE DEVICES

[75] Inventors: William D. Miller; Gary L. Harrington, both of Colorado Springs, Colo.; Lawrence M. Fullerton, Chandler, Ariz.

[73] Assignee: Ceram, Inc., Colorado Springs, Colo.

[21] Appl. No.: 940,769

[22] Filed: Sep. 4, 1992

Related U.S. Application Data

[63] Continuation of Ser. No. 627,722, Dec. 14, 1990, abandoned.

[51] Int. Cl.$^5$ .............................. G11B 5/00; G11B 5/09
[52] U.S. Cl. ........................................... 360/8; 360/48
[58] Field of Search .................... 360/8, 40, 48, 9.1; 341/51, 106; 358/906, 133, 135, 261.2, 261.4, 426

[56] References Cited

U.S. PATENT DOCUMENTS

| | | | |
|---|---|---|---|
| 4,467,421 | 8/1984 | White | 364/200 |
| 4,701,745 | 10/1987 | Waterworth | 340/347 DD |
| 4,847,619 | 7/1989 | Kato et al. | 341/106 |
| 4,876,541 | 10/1989 | Storer | 341/51 |
| 4,939,598 | 7/1990 | Kulakinski et al. | 360/48 |
| 5,003,307 | 3/1991 | Whiting et al. | 341/51 |

FOREIGN PATENT DOCUMENTS 0120330  3/1984  European Pat. Off. .
378316  7/1990  European Pat. Off. .

OTHER PUBLICATIONS

Hannon, "What's keeping data compression off disks?", Computer Technology Review, vol. 10, No. 15, Dec. 1990, pp. 26–28.

Primary Examiner—Aristotelis Psitos
Assistant Examiner—Won Tae C. Kim
Attorney, Agent, or Firm—John G. Graham

[57] ABSTRACT

A random-access type storage device such as a hard disk or semiconductor memory is formatted to provide multiple partitions of varying block size. The data to be stored is in blocks of fixed size, and these blocks are compressed if the compressed size fits in the block size of a small-block partition in the storage device. If a data block is not compressible to the small block size, it is stored uncompressed in another of the partitions. The memory device also contains a table storing the locations of the blocks in the partitions, so upon recall the block is retrieved from its location, decompressed (if it had been compressed), and sent to the CPU. For example, there may be two partitions, one using the block size of the original (uncompressed) data, and the other having a block size corresponding to the typical compressed size of the blocks of data (perhaps one-half the size of the original data blocks). The relative number of blocks in each partition (e.g., the physical storage capacity of each partition) is set at the average ratio of compressible blocks to uncompressible blocks for the compression algorithm used. For example, an algorithm may compress 90% of the blocks to 50% of their original size, so a ratio of the number of blocks in the compressed partition to the number of blocks in the uncompressed partition is selected as 90:10.

25 Claims, 4 Drawing Sheets

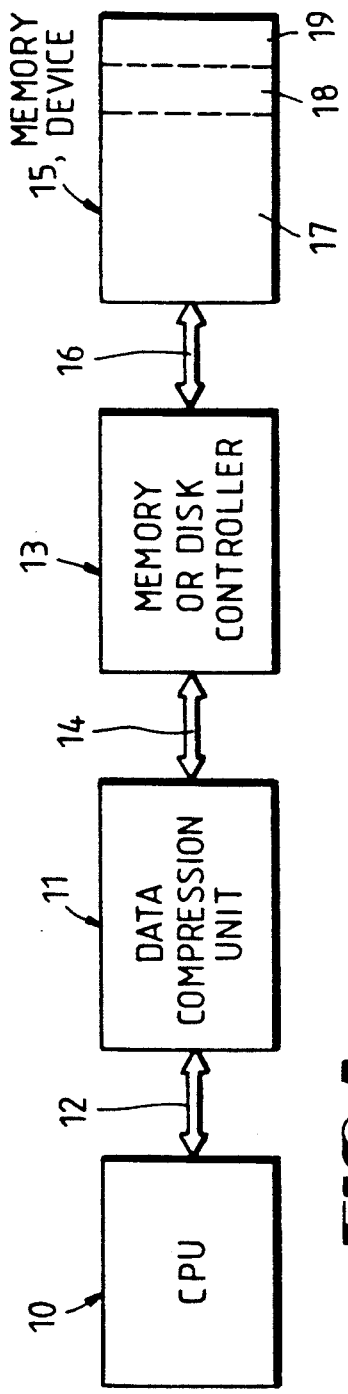
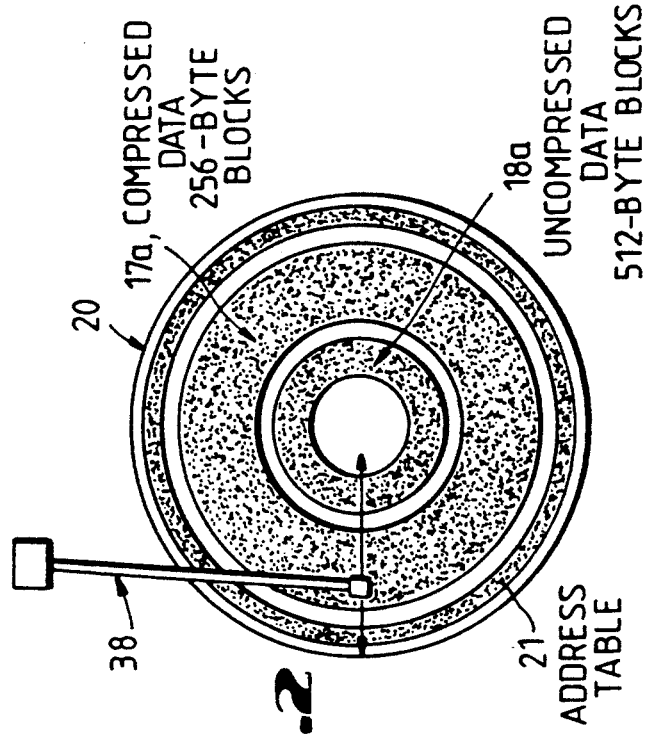
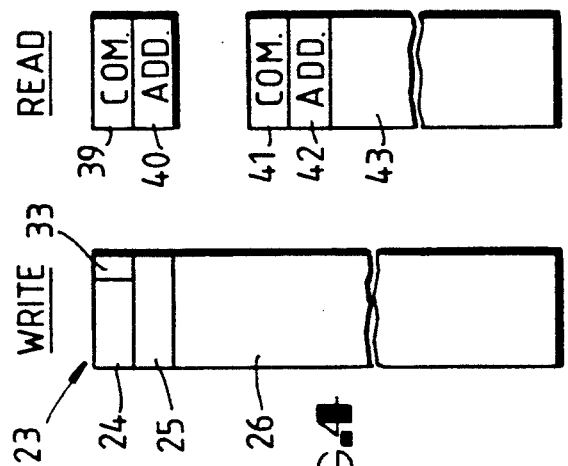

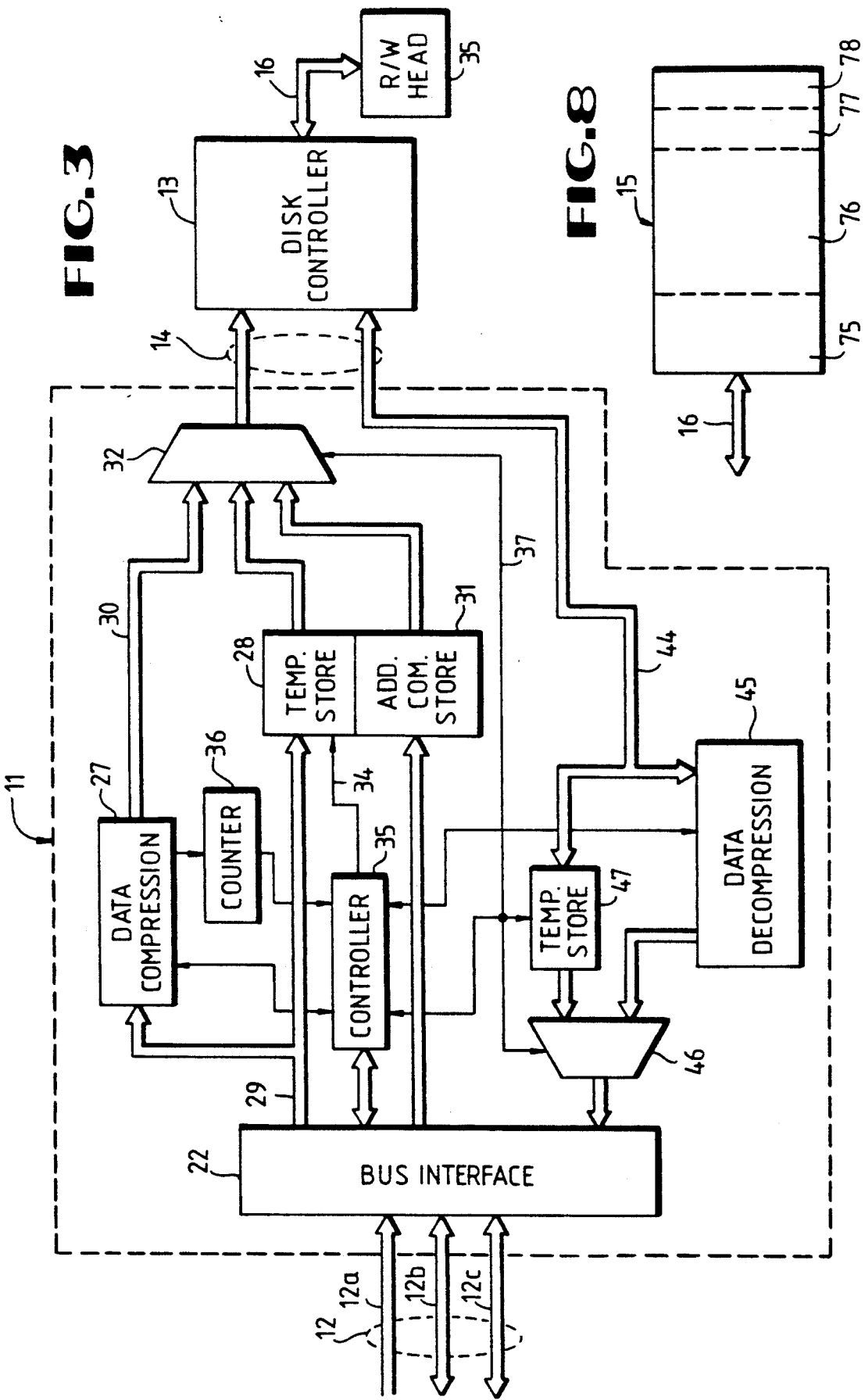

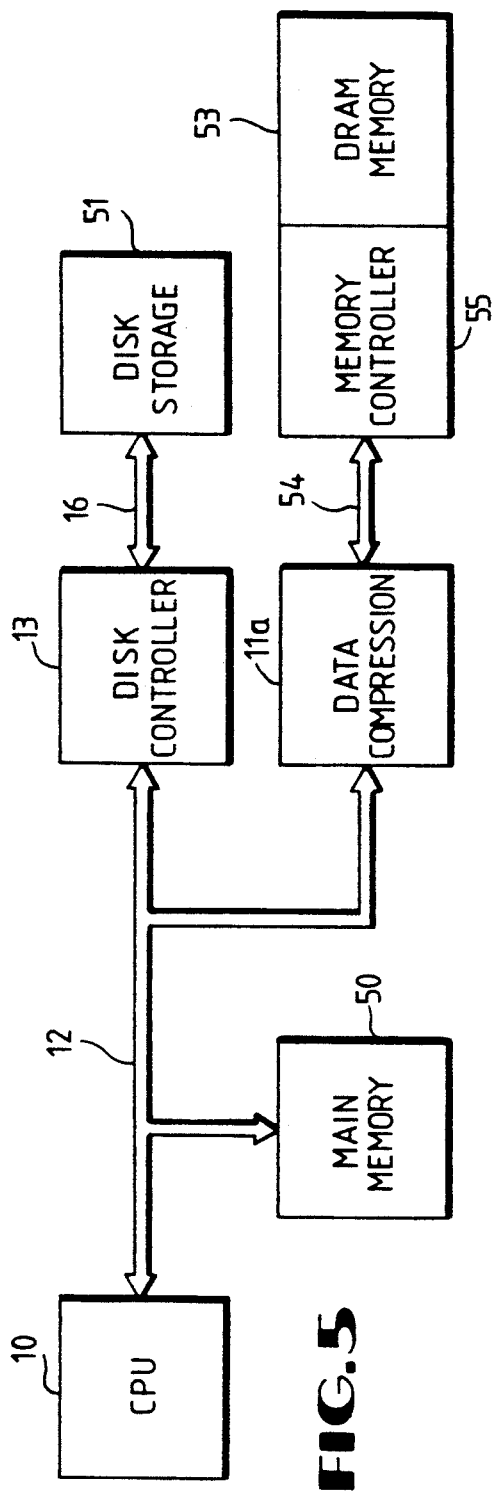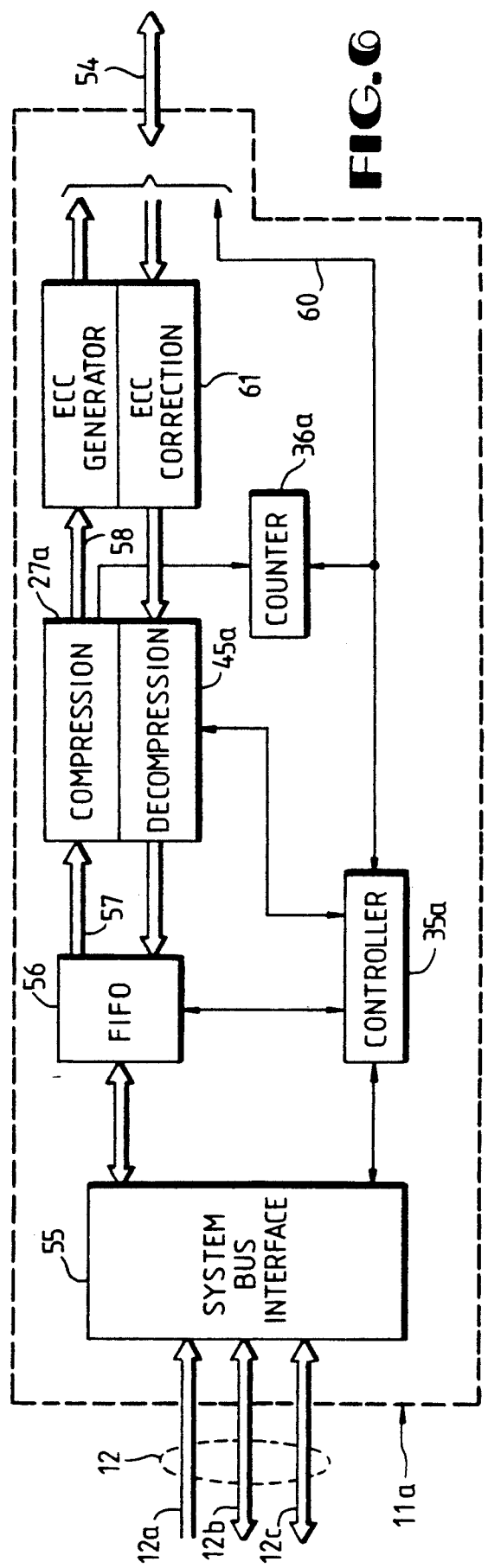

STORAGE OF COMPRESSED DATA ON RANDOM ACCESS STORAGE DEVICES

This application is a continuation of application Ser. No. 07/627,722, filed Dec. 14, 1990, now abandoned.

BACKGROUND OF THE INVENTION

This invention relates to digital data storage and retrieval, and more particularly to block-oriented storing of compressed or uncompressed data in randomly-accessed locations of fixed size in a partitioned storage device.

Data compression encoding algorithms are commonly applied to data which is to be archived or stored at the tertiary storage level. In a hierarchy of data storage, a RAM directly accessed by a CPU is often referred to a the primary level, the hard disk as the secondary level, and tape (back up) as the tertiary level. The characteristic of tertiary level storage as commonly implemented which supports use of compression is that the data access is largely sequential. Data is stored in variable-length units, sequentially, without boundaries or constraints on the number of bytes or words in a storage unit. Thus, if a file or page being stored compresses to some arbitrary number of bytes this can be stored as such, without unused memory due to fixed sizes of storage units. Compression can be easily applied in any such case where the data is not randomly accessed but instead is sequentially accessed. For this reason, data compression works well for data streaming devices such as magnetic tape. It has been applied to databases holding very large records on magnetic and optical disks.

Data compression is not readily adaptable for use with random access storage devices such as hard disks or solid-state disks, although in many cases it would be desirable to do so. The reason for this lack of use of data compression is that algorithms for data compression produce compressed data units which are of variable size. Blocks of data of fixed size compress to differing sizes depending upon the patterns of characters in the blocks; data with large numbers of repeating patterns compress to a greater degree than a more random distribution of characters. Text files and spreadsheet files compress to smaller units than executable code or graphics files. This problem of variable-length records has made random access of compressed data records, as managed by operating systems and controllers in computer systems, impractical.

It is the principal object of this invention to provide an improved method of storing data in a computer system or the like, and particularly to provide a method of compressing data blocks for storage in a storage medium having an access capability for storing data units of fixed size. Another objects is to provide an improved data compression arrangement using a random-access type of storage device, where the data units to be stored and recalled are of fixed length and the storage device is accessed in fixed-length increments. A further object is to reduce the amount of unused storage space in a storage device when compressed data units are stored, and therefore increase the storage density. An additional object is to provide an improvement in the cost per byte of storage capacity in a storage device.

SUMMARY OF THE INVENTION

In accordance with one embodiment of the invention, a storage arrangement is employed which has multiple partitions, where each partition is a section of available physical storage space having an address known to the system which differentiates it from other partitions. The storage arrangement may be a hard disk, or a semiconductor RAM array, or a combination of the two, as will be described. The data to be stored is in blocks, i.e., units of data of some fixed size, as distinguished from byte or word oriented data of variable length. The partitions are capable of holding multiple blocks, each randomly accessible. The data blocks may be compressed if the compressed size fits in the block size of a partition in the storage device. To accommodate data which is compressible to a varying degree, yet avoid waste of unused space in the partitioned memory device, the partitions are made of differing block sizes; for example, there may be two partitions, one using the block size of the original (uncompressed) data, and the other having a block size corresponding to the typical compressed size of the blocks of data. This compressed size may be perhaps one-half the size of the original data blocks in a typical situation. A data storage device, such as a magnetic disk, is thus partitioned into two (or more) parts; an uncompressed block partition for which an addressing scheme is established (e.g., by formatting) for a block size equal to that of the original uncompressed data, and a compressed block partition formatted for a block size equal to that of a compressed version of the original block size for the majority of cases. The relative number of blocks in each partition (e.g., the physical storage capacity of each partition) is set at the average ratio of compressible blocks to uncompressible blocks for the compression algorithm used. By compressible it is meant that the block of data can be compressed to the block size of the compressed block partition, and by uncompressible it is meant that the block will not compress to the required block size to fit in the compressed block partition. It is reasonable to select an algorithm that will compress 90% of the blocks to 50% of their original size, so in this case a ratio of the number of blocks in the compressed partition to the number of blocks in the uncompressed partition is selected as 90:10. The size of the blocks is selected to be some efficient value depending upon the system and the way data is handled in the system; for example, the block size is probably best selected to be a submultiple of the page size, and the page size is typically 2K-bytes or 4K-bytes in the most commonly-used operating systems. Thus, the block size of uncompressed data may be selected to be 512-bytes, and compression to 50% would mean the compressed data blocks are 256-bytes in size. Another combination would be 1K-byte uncompressed blocks and 512-byte compressed blocks. If solid-state memory is used, the block sizes may be selected to correspond to the row or column sizes of the semiconductor memory chips used, for convenient addressing.

In operation, the system sends (writes) data in blocks to the storage device, and before being written the data blocks pass through a compression unit which attempts to compress the blocks using the algorithm of choice. A counter keeps track of how many bytes of physical storage are required to store the compressed data. If the number exceeds the size of the blocks used for physical data storage in the compressed data partition, then the data block is written uncompressed in the other partition and the addressing information recorded to reflect this. But if the block is compressed to the number of bytes of the compressed partition then the data is stored in the compressed partition and the address recorded as such.

Using the parameters of the example embodiment mentioned above, the amount of increase in storage density can be calculated. If 90% of the data blocks are compressed to 256-bytes and 10% left at 512-bytes, the average compression is 57%, or the effective storage capacity of a given storage device is increased by a factor of 1.75 by employing the features of the invention.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 1 is an electrical diagram in block form of a digital system including a storage device for data blocks which may use features of the invention;

FIG. 2 is a diagram of a magnetic disk which may be used as the storage device for compressed or uncompressed data blocks according to one embodiment of the invention;

FIG. 3 is an electrical diagram in block form of a data compression unit used in the system of FIG. 1;

FIG. 4 is a diagram of the formats of data blocks, commands and addresses transmitted between units of the system of FIG. 1;

FIG. 5 is an electrical diagram in block form of a computer system employing data storage according to another embodiment of the invention;

FIG. 6 is an electrical diagram in block form of a data compression unit used in the system of FIG. 5;

FIG. 8 is a diagram of a memory device having three data storage partitions, according to a further embodiment of the invention.

DETAILED DESCRIPTION OF SPECIFIC EMBODIMENTS

Figure 7:
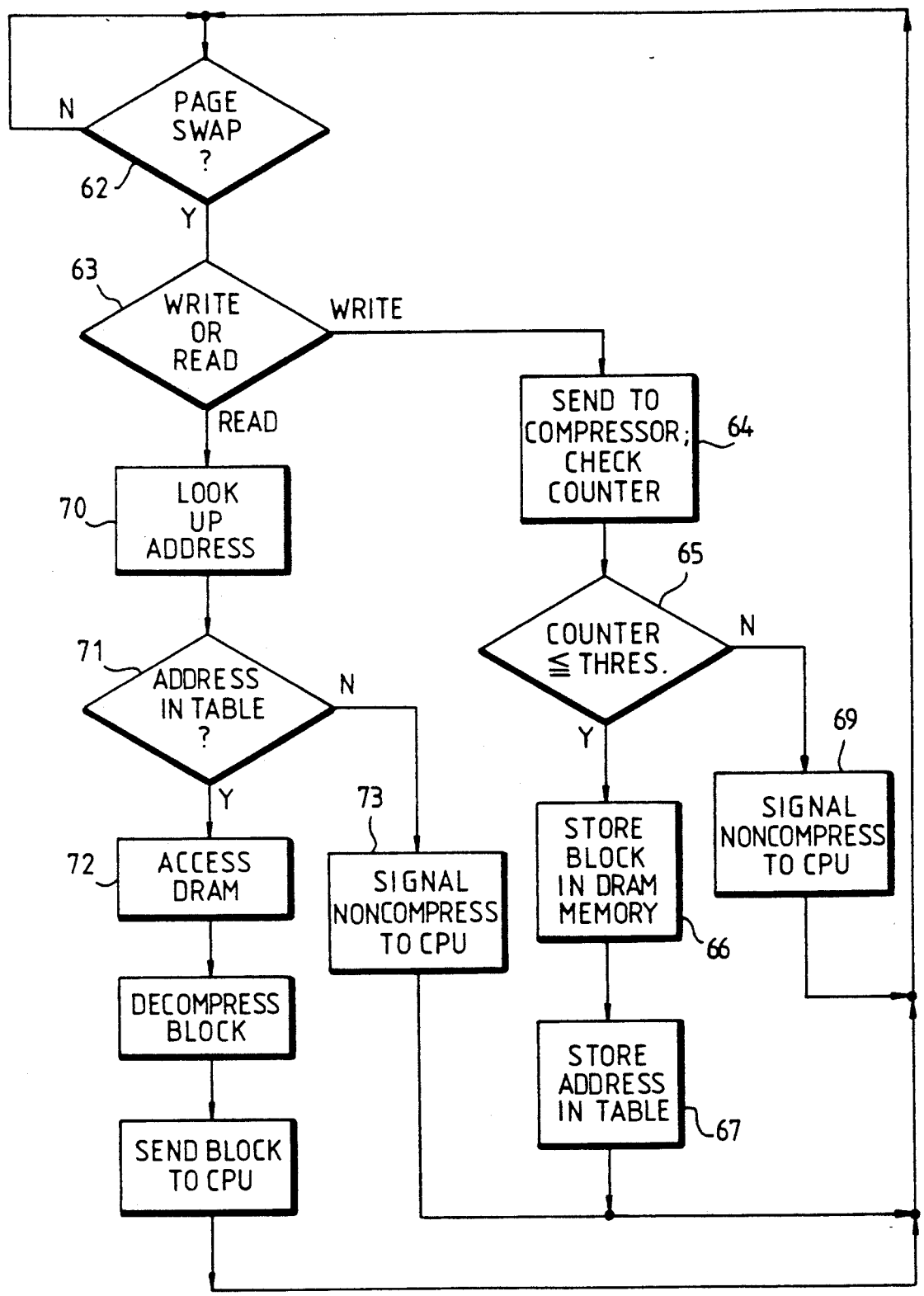
FIG. 7 is a logic flow chart illustrating the operation of the system of FIGS. 5 and 6.

Referring to FIG. 1, a data compression method according to the invention is used in a system having a source 10 of data to be stored and recalled, and in a typical application this source would be a CPU or the like, although various other data sources may use the features herein disclosed. The data source 10 is coupled to a data compression mechanism 11 by a system bus 12, so that when the source 10 has a unit of data to store it is sent by the bus 12 along with appropriate addresses and controls in the usual manner of operating a CPU with disk storage or the like. In a typical use, the CPU may be executing an operating system using virtual memory, and pages of data are swapped between a main memory in the CPU itself and a hard disk represented by the memory 15. As will be explained, the data compression mechanism 11 examines each block of data received from the source 10 and determines whether or not compression is elected for this block. If compression is elected, the compression mechanism 11 sends the compressed block of data to a memory or disk controller 13 via bus 14, from which the compressed block is written to a storage unit 15 by an input/output path 16. The storage unit 15 contains two storage areas 17 and 18 for two sizes of block-oriented storage, one for compressed blocks and the other for uncompressed blocks. If compression is elected in the compression unit 11, then the compressed block of data is sent through the controller 13 to be stored in the area 17. On the other hand, if compression is not elected, the compression mechanism 11 sends the uncompressed block of data through the controller 13 to be written to the area 18 of the memory 15. In addition, a memory area 19 is provided to store the addresses (locations in memory areas 17 or 18) of the compressed or uncompressed blocks, i.e., correlating the block addresses used by the CPU 10 with the physical locations in the memory device 15.

According to one embodiment of the invention, the memory 15 may be a hard disk 20 as seen in FIG. 2, partitioned as two separate storage spaces, one for compressed data and the other for uncompressed data. That is, the disk 20 has a section 17a formatted to accept 256-byte blocks of data, for example, and a separately-addressed section 18a formatted to accept 512-byte blocks of data. The minimum block (and only sized block) that may be addressed is 256-bytes long for partition 17a and 512-bytes for partition 18a. Alternatively, instead of having two partitions on one disk 20, two disks may be used, one formatted for 256-byte blocks and the other for 512-byte blocks. As will be explained, the ratio of sizes of the two partitions 17a and 18a is perhaps 90:10, i.e., 90% of the storage space is formatted for compressed data with 256-byte blocks and 10% is formatted for uncompressed data with 512-byte blocks. Thus, if two separate disks are used, then one would be much larger than the other, e.g., a 20 Meg drive and a 180 Meg drive.

For recall of data stored on the memory 15, the system of FIG. 1 uses the address from area 19 for each block to determine if the block was stored on the section 17 as compressed data or stored on the section 18 as uncompressed data. The source 10 merely sends out an address on the bus 12 (e.g., the virtual memory address) to recall a given block, and does not itself need to keep track of which partition was used to store a given block. The storage area 19 used to store the physical positions of the blocks, i.e., which partition and the addresses of the blocks within the partition, may take the form of a section 21 of the disk 20 of FIG. 2, or it may be in a separate memory device. Thus, when the source 10 sends an address and command on bus 12 indicating a request to recall a block of a given address, the table in memory area 19 is first referenced to determine the location on the disk or in memory 15, then the controller 13 is activated to recover this location and the data is directed via controller 13 to the compression unit 11. The compression mechanism 11 decompresses the data coming from partition 17 via controller 13, or passes through without decompression data from partition 18. The block addressed by the CPU 10 is thus delivered via bus 12 in an uncompressed state.

With reference to FIG. 3, one example of the construction of the data compression mechanism 11 using the features of the invention is illustrated. The compression mechanism receives data from the source 10 by the bus 12 which typically would include an address bus 12a, a data bus 12b and a control bus 12c, all being input to a bus interface unit 22. The mechanism 11 may respond to the bus just as a disk controller, i.e., the CPU sends commands and data by writing to registers in the bus interface 22 using the buses 12a, 12b and 12c in the I/O space of the CPU. As seen in FIG. 4, the CPU 10 may send a block 23 to be stored in a format including a command byte or bytes 24, an address field 25, and a 512-byte data field 26. Data to be stored, received from the source 10 in a block of 512-byte length, is directed by the interface 22 to a data compression mechanism 27 and to a temporary store 28 via bus 29 within the compression mechanism 11. The data compression mechanism 27 may be of various types of construction, and serves to accept fixed-length blocks of data from bus 29, e.g., 512-byte blocks, and to produce variable-length blocks of output data on output bus 30. The compression method used may be of the so-called Lempel-Ziv type as described by Ziv, J. and Lempel, A., "Compression of individual sequences via variable-rate coding", IEEE Trans. on Information Theory, September 1978, pp. 530-536, or other types such as described by Terry A. Welsh, "A technique for high-performance data compression", IEEE Computer, June 1984. The mechanism 27 may be a processor itself, executing code, or may be a sequential state machine or a logic network constructed of gate arrays. The amount of compression of a given block of data will depend upon the degree of repetitiveness of patterns of characters in the block, since the compression technique is usually based upon the concept of substituting a shorter code word in place of a repetitive sequence. It is empirically demonstrated that, for example, 90% of data blocks typically generated by a CPU executing ordinary applications programs will compress to 50% of their original size; thus, a 512-byte block can be stored in a 256-byte storage location, in 90% of the cases. The actual ratio of blocks which will compress to a given size is course dependent upon the mix of characters in the blocks and the compression technique employed by the compression mechanism 27, 90% being an example. Some amount of time is needed to compress the block of data 26 and produce a compressed block, and this time delay may depend upon the character mix of the data block 26. Ordinarily, only a few clock cycles are needed for compression, and in any event the delay for compression is very small compared to the seek time of a hard disk, for example. To allow for the compression delay, however, the command and address fields 24 and 25 are stored in temporary store 31 so that the compressed block 26 and the command and address fields 24 and 25 can be output onto bus 14 via multiplexer 32 when compression is complete. The disk controller 13 thus receives the data packet 23 of FIG. 4, modified to substitute the compressed data from data field 26 and including a "compressed" flag 33 in the command field 24; the address field 25 remains the same. An input 34 from a controller 35 in the compression unit 11 causes the "compressed" flag to be set in the command field 24 before being sent on to the multiplexer 32 if a counter 36 indicates that the number of bytes in the compressed block is equal to or less than the size of blocks in the compressed partition, in this case 256-bytes.

If the result of the compression operation in the mechanism 27 indicates that the data field 26 for this block cannot be compressed to the threshold number of bytes, e.g., 256-bytes or less, then the data field 26 is transmitted directly from the temporary store 28 to the bus 14 via multiplexer 32 without compression. Control lines 37 from the controller 35 in the data compression unit 11 command the multiplexer 32 to output a data packet onto bus 14 and determine whether the data packet is to include the compressed or uncompressed version of the data field 26. If the uncompressed version is used, then the "compressed" flag in the command field will not be set.

The disk controller 13 functions in the normal manner of such devices and responds to a store command in a received packet by writing the data field 26 into the next free sector or block on the disk 20 and writing the address from field 25 into the address store 21 in the location corresponding to the sector where the data field is being stored. In addition, the disk controller 13 responds to the "compressed" flag in the command field 24 to store the block in either the compressed partition 17a or the uncompressed partition 18a. The location of the address stored in section 21 of course reflects whether the block is stored in partition 17a or 18a.

Depending upon the compression delay and various other factors, the temporary store 28 may be eliminated in an alternative embodiment, and instead all data blocks sent straight through the unit 11 and conditionally stored as uncompressed data in partition 18a, while at the same time the data field 26 is being compressed in mechanism 27. After the compression operation has been completed then if the level of compression is below the 256-byte limit the data block is stored again as compressed data in the partition 17a and the just-stored block of uncompressed data erased. Erasing the uncompressed block merely consists of resetting a bit in the address table 21 to "empty". If the time to record the uncompressed block onto the disk 20 is less than the compression time, then a time savings will result by using this alternative, as well as a savings in eliminating the 512-byte store 28.

The disk controller 13 accepts commands, usually in the form of data words written to specified registers in the I/O space of the CPU, and if the command is to "store" it is followed by a block of data, similarly written to an input register of the disk controller. The controller functions to cause a read/write head 38 to go to the track containing the sector in which the block is to be written, as selected by the controller 13, then to write the block in this 256-byte or 512-byte block, i.e., in one of the partitions 17a or 18a. If the command sent to the disk controller 13 is a "read" command it will be of the format of FIG. 4; here the controller 13 accepts the read command 39 and a virtual address 40. Some time later, after the disk controller 13 has looked up the physical location in the table of track 21 and the read/write head 36 is positioned to read the block in question, the controller 13 sends a data block as seen in FIG. 4, including a command field 41, an address field 42 and a data field 43. The command filed 41 contains a "compressed" flag indicating whether the block of data came from partition 17a or 18a, i.e., was compressed or uncompressed.

The data compression unit 11 contains a separate path including a bus 44 and a decompression mechanism 45 for read data returned from the disk controller 13. Upon receiving the command field 41 indicating that the disk controller 13 is sending read data, the controller 35 of the data compression unit 11 responds to the "compressed" flag to route the read data block 43 through the decompression mechanism 45 or directly to the interface 22 via multiplexer 46.

The storage mechanism using two partitions 17 and 18 in memory for compressed or uncompressed blocks is thus transparent to the CPU 10, as the CPU need not either make the decision of storing compressed or uncompressed, nor remember the type of storage used or the location. The data to be stored is merely sent to storage in the usual manner; to the CPU it appears to be communication with a standard disk controller 13. Similarly, the disk controller (or corresponding memory controller if semiconductor memory is used in place of a disk), operates as if it were receiving commands and data from, or sending data to, the CPU, in the usual manner, the only added functions are (1) the ability to control a disk formatted as two separate partitions 17a and 18a of differing block size, and (2) recognize another control or address bit (the "compressed" flag) in the commands indicating which partition 17a or 18a to store a block. The location in partition 17a or 18a will be recorded in the track 21 just as the virtual and physical addresses are recorded.

Referring to FIG. 5, the data compression arrangement as described above may be used in a system employing both hard disk storage and DRAM memory, according to another embodiment of the invention. The CPU 10 as in FIG. 1 is coupled to a data compression unit 11 by the system bus 12, and this system bus also accesses a main memory unit 50, and accesses disk storage 51 by a disk controller 13. A device driver 52 is responsive to calls made to the disk controller 13 by the operating system executing in the CPU 10; this device driver is actually software overlying the operating system and responds to references to the memory locations used to access the command and data registers in the disk controller 13 when a page swap is being executed by the memory management functions of the operating system. When a page swap is started, the data from the outgoing page is written from the memory 50 onto the system bus 12; upon interception by the device driver 52 the data compression unit 11 receives blocks of data of the page that the CPU wishes to store, and attempts to compress the blocks; if a block compresses to the selected threshold value, the block is stored in compressed storage, but if not it is stored uncompressed. Here, the uncompressed storage is in the disk 51, and this disk 51 may be the hard disk used by the CPU 10 for storing files or the like, but has a partition especially for uncompressed data storage, i.e., page swapping. The compressed storage, instead of being on the same magnetic disk as the uncompressed storage (as it is in FIG. 2), is in a semiconductor storage unit 53, coupled to the data compression unit 11 by a bus 54 and a DRAM controller 55. This system is used in a virtual memory management arrangement in which the operating system (e.g., Unix TM) executing on the CPU 10 establishes a paged virtual memory space much larger than the number of pages which may exist in the physical memory 50, then upon demand or according to some algorithm, pages are swapped between the physical memory 50 and secondary storage (disk 51 and memory 53). The page size is typically 4K-bytes, and in this example the block size for storage via the compression unit is chosen as 4K-bytes. Thus, a page to be swapped out of the memory 50 is a 4K block identified by the address of the first byte of a 4K-byte page, in which case the low-order twelve bits of the address are zeros and may be truncated, as in the page tables maintained by the operating system. As explained above, the block is sent by the CPU on the bus 12, received by the unit 11, and compression is attempted. If the compressed block is of a size equal to or less than the threshold value, the block is stored in the DRAM memory 53, but if it compresses to a larger value, it is stored uncompressed in the hard disk 51. In one example, the compressed block size is chosen to be 2560-bytes, allowing ten memory chips of 256-bit row size, or five memory chips of 512-bit row size, in banks of eight or nine, to be used in constructing the memory 52. If it is assumed that 80% of the 4K-byte pages will compress to 2560-bytes (64%), then the memory 52 should be able to hold 80% of the pages (compressed), so the size ratio between the disk 51 and the memory 52 is selected accordingly. For faster access, the page table giving the location of each stored page, corresponding to the partition 19 of FIG. 1, is located in the DRAM memory 53 rather than in the hard disk 51. The access time of the DRAM memory 53 is of course much faster than that of the disk 51, so the compression time is at least partially counterbalanced. When a page is requested by the CPU 10, in 80% of the occurrences the page will be in the DRAM memory 53 instead of the hard disk 51, so the block of compressed data is available much sooner than if the disk 51 had to be accessed. Indeed, if the decompression time is small, the overall access time may be reduced in the system of FIG. 5 compared to page swapping to a hard disk.

Referring to FIG. 6, the compression and decompression unit 11a of FIG. 5 is shown in more detail. A system bus interface 56 is connected to the system bus 12 and responds to bus commands, similar to the bus interface 22 of FIG. 3. Data to be read or written to the DRAM memory 53 is coupled to or from the data bus 12b of the system bus by a buffer in the form of a FIFO memory 56, which may be four words deep, for example. Data to be compressed is applied by byte-wide bus 57 to the compression mechanism 27a, and compressed data is applied by bus 58 to an ECC generator circuit 59 to produce an error correcting code. The compressed data plus error correcting code is sent for storage in the DRAM array 53 via bus 54 and memory controller 55. As before, a counter 36a maintains a count of the number of bytes a block is compressed to, and if the count exceeds 2560 for a block then the compression store is aborted. The storage operation for a block is completed only if the count in the counter 36a is 2560 or less, under command of the controller 35a. The address (location) of the stored compressed block and its virtual (page) address is also stored in a table in a partition 19 of the DRAM memory via path 60. When a block of data is to be recalled, the controller 35a accesses the table to search for the location, then reads the block from DRAM array 53 via bus 54 into the ECC correction circuit 61 where the ECC code stored for this block is checked against the data being read out, and if a correctable error is found the correction is made. The data block is then applied to the decompression mechanism 45a where it is expanded to its original form, then applied to the system bus 12 via FIFO memory 56.

As indicated above, the system of FIGS. 5 and 6 can operate on the basis of storing every page-write to magnetic disk 51 while the compression step is being attempted in the data compression unit 11a, then, if compression is successful, the page just written to disk can be invalidated; this way, the reduction in system performance due to compression time is avoided.

Operation of the system of FIGS. 5 and 6 is illustrated in the logic flow chart of FIG. 7. As indicated by the decision block 62, the device driver 52 examines each reference to the disk via bus 12 to see if a page swap is being initiated. If so, the decision block 63 determines whether it is a read or a write. If a write, control passes to block 64, indicating that the block of data is directed to the compression mechanism 27a, then if the counter 36a shows a count equal to or less than 2560, indicated by decision block 65, the compressed block is stored in DRAM memory 53 as indicated by the block 66 and the address is stored as indicated by block 67, after which control is returned via path 68 to the block 62. If the count is greater than 2560, the control passes to block 69 where the controller 35a signals to the device driver 52 that the compressed storage failed and the disk access proceeds as before, storing the block uncompressed on magnetic disk 52 via disk controller 13, after which control returns via path 68 to the block 62. If the block 63 indicates a read, the address is recovered by a table look up indicated by a block 70. If the address is found in the DRAM table, indicated by decision block 71, the DRAM 53 is accessed as indicated by block 72, the data is decompressed and sent to the CPU 10, then control returns to the decision block 62 via path 68. If the address is not found in the DRAM, control passes to the block 73 where the device driver 52 is signalled to indicate that the data is not in the DRAM so the disk 51 should be accessed to read the data.

In another embodiment of the invention, the storage medium used for the memory device 15 of FIG. 1 or FIGS. 5 and 6 may be non-volatile semiconductor memory such as flash EPROM, for example. This embodiment would be used to store code employed in the operating system, for example, or boot code. That is, if the memory is used for information that is seldom or never changed then the memory can be read-only (updates to the code would be made by a field upgrade in which the code is erased and re-written in the memory devices, not using the operating system itself). A compression unit 27 or 27a is not needed, since no blocks are sent by the CPU to be stored; only a decompression unit 45 or 45a is needed. When a page is requested, the tables in partition 19 are referenced to determine the location, then the block is retrieved from partition 17 and decompressed if it had been stored in the compressed area, or retrieved from partition 18 if uncompressed. If compressed, the block will pass through the decompression unit 45; if not, the block is sent to the CPU directly.

Referring now to FIG. 8, the features of the invention can be employed also in a three-way partitioning of the memory device 15, instead of two-way as discussed above. For example, it may be found that 20% of the data blocks compress to 25% or less of their original size, 60% compress to 25-to-50% of original size, and 20% won't compress to 50% or below. The memory device 15 of FIG. 8 thus has a partition 75 of 1024-byte block size to receive the blocks compressed to 25% size or less, a second partition 76 of 2048-byte size to receive the blocks compressed 25-50%, and a partition 77 to receive the uncompressed blocks. As in FIG. 1, a memory area 78 stores a table of the location of the blocks in the partitions 75, 76 and 77. In this case, the "compressed" flag as referred to above would have to be a two-bit value to allow three values: compressed-25%, compressed-50% and uncompressed. The compression algorithm may also encode an indication of the amount of compression in the data block, in which case the decompression unit 45 would respond to this indication, functioning as the "compressed" flag to indicate in which partition the data block is stored.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of processing blocks of data received from an input and storing said blocks of data in a memory device so that data in any of said blocks can be retrieved in original form, the blocks of data being of fixed size, comprising the steps of:
   a) partitioning the memory device to provide a first memory space containing a large number of memory locations of a first size, said first size being smaller than said fixed size, each of said memory locations of a first size being capable of storing a compressed version of one of said blocks of data, and to provide a second memory space containing a large number of memory locations of said fixed size, each of said memory locations of a fixed size being capable of storing an uncompressed version of one of said blocks of data;
   b) receiving from said input and compressing each of said blocks of data to produce a compressed block, and detecting whether or not each said compressed block is as small as said first size to produce a size indicator;
   c) storing each of said blocks of data, so that data in any of said compressed blocks of data can be expanded to original form, either in said first memory space as a compressed block or in said second memory space as an uncompressed block in response to said size indicator produced by said step of detecting.

2. A method according to claim 1 wherein said step of storing includes writing said blocks of data to a magnetic disk.

3. A method according to claim 2 wherein said step of partitioning includes writing to said disk to define said first memory space as a first partition of said disk and said second memory space as a second partition of said disk.

4. A method according to claim 3 wherein said first partition is much larger than said second partition.

5. A method according to claim 4 wherein said fixed size is about twice as large as said first size.

6. A method according to claim 1 including the steps of receiving a separate address with each of said blocks and storing said address in said memory device associated with a location of said block in said first or second memory spaces.

7. A method according to claim 6 including the step of recalling said data blocks by
   d) receiving a request for one of said blocks using said address for said block;
   e) finding said address for said block in said stored addresses and determining the location of said block;
   f) detecting whether or not said block was stored in said first memory space; and
   g) decompressing said block if stored in said first memory space.

8. Apparatus for processing blocks of data received from an input and storing said blocks of data in a memory device, so that any data in said blocks of data can be retrieved in original form, the blocks of data being of fixed size, comprising:

a) a first memory space in said memory device containing a large number of memory locations of a first size, said first size being smaller than said fixed size, each of said memory locations of a first size storing a compressed version of one of said blocks of data;

b) a second memory space in said memory device containing a large number of memory locations of said fixed size, each of said memory locations of said fixed size storing an uncompressed version of one of said blocks of data;

c) means for receiving from said input and compressing each of said blocks of data to produce a compressed block, and means for detecting whether or not each said compressed block is as small as said first size and producing a size indicator in response to said detecting;

d) and means for storing each of said blocks of data either in said first memory space as a compressed block whereby data of a compressed block can be expanded to original form, or in said second memory space as an uncompressed version, in response to said size indicator produced by said means for detecting.

9. Apparatus according to claim 8 wherein said first and second memory spaces are defined in a magnetic disk.

10. Apparatus according to claim 9 wherein said first memory space is larger than said second memory space.

11. Apparatus according to claim 10 wherein said fixed size is about twice as large as said first size.

12. Apparatus according to claim 8 including means for receiving a separate address with each of said blocks and storing said address in said memory device associated with a location of said block in said first or second memory spaces.

13. Apparatus according to claim 12 including means for recalling said data blocks, including:

e) means for receiving a request for one of said blocks including said address for said block;

f) means for finding said address for said block in said stored addresses and determining the location of said block;

g) means for detecting whether or not said block was stored in said first memory space; and h) means for decompressing said block if stored in said first memory space.

14. A digital system comprising:

a) a source of data blocks of fixed length;

b) storage means having first storage locations of at least one selected size less than said fixed length and second storage locations of said fixed length;

c) a data compression unit receiving said data blocks from said source and compressing all of the data in each of said data blocks to produce a compressed block, so that data in any of said data blocks can be expanded to its original form;

d) means for detecting whether each of said data blocks is compressed to said selected size by said data compression unit and producing a size indicator in response to said detecting;

e) and means responsive to said size indicator for storing a compressed block in one of said first storage locations if said compressed block is as small as one of said at least one selected size, or for storing one of said data blocks in one of said second locations if said compressed block for said one of said data blocks is larger than any one of said at least one selected size.

15. A system according to claim 14 wherein said first and second storage locations are defined in a magnetic disk.

16. A system according to claim 15 wherein said first storage locations occupy a first memory space which is large than a second memory space occupied by said second storage locations.

17. A system according to claim 16 wherein said fixed size is about twice as large as said at least one selected size.

18. A system according to claim 14 including means for receiving a separate address with each of said blocks and storing said address in said storage means associated with one of said first or second storage locations.

19. A system according to claim 18 including means for recalling said data blocks, including:

e) means for receiving a request for one of said blocks including said address for said block;

f) means for finding said address for said block in said stored addresses and determining the location of said block;

g) means for detecting whether or not said block was stored in one of said first storage locations; and h) means for decompressing said block if stored in one of said first storage locations.

20. A system according to claim 14 wherein said storage means includes third storage locations of a third size less than said selected size; and said means for storing stores a compressed block in said third storage location if said compressed block is as small as said third size.

21. A system according to claim 14 wherein said first storage locations are defined in semiconductor memory and said second storage locations are defined in a magnetic disk.

22. Apparatus receiving blocks of data of fixed size and storing said blocks of data in a memory so that said blocks of data can be retrieved in original form, comprising:

a) a first memory space in said memory containing memory locations of a first size, each of said memory locations of a first size storing a compressed version of one of said blocks of data;

b) a second memory space in said memory containing memory locations of said fixed size, each of said memory locations of said fixed size storing an uncompressed version of one of said blocks of data;

c) means for compressing each of said blocks of data and storing in said memory each of said blocks of data either in one of said first memory spaces as a compressed version which may be expanded to original form or in one said second memory spaces as a uncompressed version;

d) a third memory space containing a table of the locations of blocks of data in said first and second memory spaces;

e) means for receiving a request for one of said blocks including an identification of said block;

f) addressing means for accessing said third memory space in response to said request for finding said identification in said table of locations in said third memory space and determining the location of said one of said blocks in said first or second memory space from said table of locations and retrieving said one of said blocks;

g) output means including decompressing means and including means for detecting from said addressing means if said one of said blocks was stored in said first memory space, and, if so, decompressing said one of said blocks by said decompressing means to expand said block to its original form.

23. Apparatus according to claim 22 wherein said first and second memory spaces are defined in a magnetic disk.

24. Apparatus according to claim 22 wherein said first memory space is constructed of semiconductor memory devices and said second memory space is defined in a magnetic disk device.

25. Apparatus according to claim 22 wherein said first and second memory spaces are defined in semiconductor memory devices of a non-volatile type.

* * * * *